United States Patent
Peavey et al.

(10) Patent No.: US 7,145,392 B2
(45) Date of Patent: Dec. 5, 2006

(54) METHODS AND APPARATUS FOR VARIABLE HARMONIC DISTORTION

(75) Inventors: Hartley D. Peavey, Meridian, MS (US); John Calvin Fields, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 168 days.

(21) Appl. No.: 10/894,205

(22) Filed: Jul. 19, 2004

(65) Prior Publication Data

US 2006/0012424 A1   Jan. 19, 2006

(51) Int. Cl.
*H03F 3/26* (2006.01)
(52) U.S. Cl. .................. 330/262; 330/122; 330/269
(58) Field of Classification Search ................ 330/118, 330/120, 122, 262, 269; 381/120; 330/275, 330/276
See application file for complete search history.

(56) References Cited

U.S. PATENT DOCUMENTS 2,762,874 A * 9/1956 Barco .................... 330/275
4,345,502 A * 8/1982 Jahns .................... 84/723

OTHER PUBLICATIONS

The Ultimate Tone, vol. 2, Systems Approach To Stage Sound Nirvana by Kevin O'Connor.
The Ultimate Tone, vol. 3, Generations of Tone by Kevin O'Connor.
The Ultimate Tone, vol. 5, Tone Capture by Kevin O'Connor.
Kevin O'Connor, TUT2 The Ultimate Tone vol. 2—Systems Approach to Stage Sound Nirvana, web page, 1997, ISBN 0-9698-6083-8, 2 pages.
Kevin O'Connor, TUT3 The Ultimate Tone vol. 3—Generations of Tone, web page, 2002, ISBN 0-9698-6088-9, 2 pages.
Kevin O'Connor, TUT5 The Ultimate Tone vol. 5—Tone Capture, web page, 2004, ISBN 0-9698-6089-7, 2 pages.
True Blue; Review Amplifier; Sheldon Truetone 3; Guitar Buyer; May, 2004; 3 pages.

* cited by examiner

*Primary Examiner*—Steven J. Mottola
(74) *Attorney, Agent, or Firm*—Kaplan Gilman Gibson & Dernier LLP

(57) ABSTRACT

Methods and apparatus for producing first and second drive signals from an input signal such that each drive signal is about 180 degrees out of phase with respect to the other; variably altering at least one of the first and second drive signals such that their respective magnitudes may be unbalanced to a varying degree; and producing an output signal from the first and second drive signals such that it includes harmonic distortion when the first and second drive signals are unbalanced.

17 Claims, 3 Drawing Sheets

METHODS AND APPARATUS FOR VARIABLE HARMONIC DISTORTION

BACKGROUND OF THE INVENTION

The present invention relates to methods and apparatus for providing variable harmonic distortion in an audio circuit, such as an audio amplifier.

Designers of guitar amplifiers back in the 1950's focused on creating amplifiers with very little distortion. This was not an easy task as solid state devices were not generally available and most amplifiers were designed and built using vacuum tubes. Although tube amplifiers inherently have more distortion than solid state amplifiers, the early amplifier pioneers tried in vain to produce amplifiers with little or no distortion. Most of their designs had a high order of distortion, especially second harmonic distortion.

In the context of electric guitar amplification, the existence of harmonic distortion in the amplifier is not undesirable. Indeed, it has been generally thought that even order harmonics are pleasing to the ear, (especially the second harmonic), while odd order harmonics are thought to sound "raucous," "raspy," and unpleasant, especially the third and fifth harmonics. The desirability of even order harmonics appears to hold even in fairly high ratios to the normal (undistorted) signal.

Thus, guitar amplification has become a niche technology within the broader universe of the audio amplification arts. What sets a guitar amplifier apart from an amplifier found in, for example, a sound system or a home stereo is that the latter seeks to reproduce sounds as closely as possible to the input signal, while a guitar amplifier significantly alters the sound and is, in essence, an extension of the instrument and a part of an overall guitar system.

Most rock guitar players use solid body guitars, which provide some degree of resonance but not nearly as much as hollow body guitars or acoustic guitars. A solid body guitar is preferred because the body is formed of a solid piece of material and, therefore, is not as prone to extraneous vibrations in response to the sound pressure waves from the amplification system. Such extraneous vibrations are also known as acoustic feedback and are to be avoided. A solid body guitar is basically a sine wave generator in that it does not produce much frequency content beyond the frequencies of the resonating guitar strings. Thus, most of the harmonics associated with the characteristic sounds identifiable as an electric guitar actually come from the amplifier and not the guitar. The harmonics introduced by the guitar amplifier differentiate one guitar system (e.g., guitar and amplifier combination) from another, thereby giving each system its own "personality."

The inherent tendency for vacuum tube amplifiers to produce harmonic distortion has made them a favorite among electric guitar players and there have been numerous design approaches to simulate vacuum tube designs in solid state amplifiers. Indeed, various kinds of asymmetrical clippers and various kinds of distortion producing circuitry have been produced to simulate second harmonic distortion. Because tube amplifiers have been around for so long, most contemporary tube amp designs utilize very similar circuitry. Most high-power tube type guitar amplifiers utilize push-pull output stages operating in class A/B. The A/B class dictates that the output signal is shared by two or more output tubes which are driven by signals that are equal but 180 degrees out of phase. Conventional wisdom dictates that the drive signals to the output tubes (specifically the grids) should be balanced to minimize distortion and limit output transformer core saturation problems (caused by asymmetrical currents through the primary).

While the design of an amplifier in accord with the conventional wisdom may be acceptable to users seeking amplifiers that minimize distortion, a guitar player will likely find the lack of harmonic content objectionable. Further, even if a guitar amplifier (whether of the tube type or solid state) introduces harmonic distortion, it would be desirable to make such distortion variable so that the player may tune the sound to his or her liking.

SUMMARY OF THE INVENTION

In accordance to one or more aspects of the present invention, the drive to one of the output amplification elements (e.g., one of the output tubes) is deliberately and variably controlled to unbalance the drive. This results in a variable amount of asymmetry in the output waveform, thereby creating harmonic distortion, which may be rich in the second harmonic content. Preferably the effect is variable through the use of a user-controlled potentiometer such that changing the resistance of the potentiometer increases/decreases the drive to one side of the output pair (with respect to the other side of the pair). For example, by adding resistance (via the control), the output from one side of the output tube pair is substantially reduced thus decreasing the amount of output power delivered to the speaker load.

In accordance with one or more aspects of the present invention, an apparatus, includes: a phase inverter operable to receive an input signal and produce first and second drive signals therefrom, each about 180 degrees out of phase with respect to the other; a distortion control circuit operable to variably alter at least one of the first and second drive signals such that their respective magnitudes may be unbalanced to a varying degree; and a push-pull output stage operable to receive the first and second drive signals and to produce an output signal therefrom exhibiting harmonic distortion when the first and second drive signals are unbalanced.

The push-pull output stage may include first and second active elements, each having at least a pair of power terminals and a signal terminal, one power terminal of each active element being coupled to a common node, and the respective first and second drive signals being coupled to the respective signal terminals. Preferably, the distortion control circuit is operable to variably increase and/or decrease the magnitude of the first drive signal with respect to the second drive signal such that the first active element is biased ON to a corresponding greater and/or lesser degree. For example, the first active element may be operable to produce one of a positive and negative going portion of the output signal and the second active element is operable to produce the other of the positive and negative going portion of the output signal. In such case, the distortion control circuit is preferably operable to variably increase and/or decrease a magnitude of the one with respect to the other of the positive and negative going portions of the output signal such that a variable amount of harmonic distortion is introduced into the output signal.

In accordance with one or more further aspects of the present invention, a method includes: producing first and second drive signals from an input signal such that each drive signal is about 180 degrees out of phase with respect to the other; variably altering at least one of the first and second drive signals such that their respective magnitudes may be unbalanced to a varying degree; and producing an output signal from the first and second drive signals such that it includes harmonic distortion when the first and second drive signals are unbalanced.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

Figure 1:
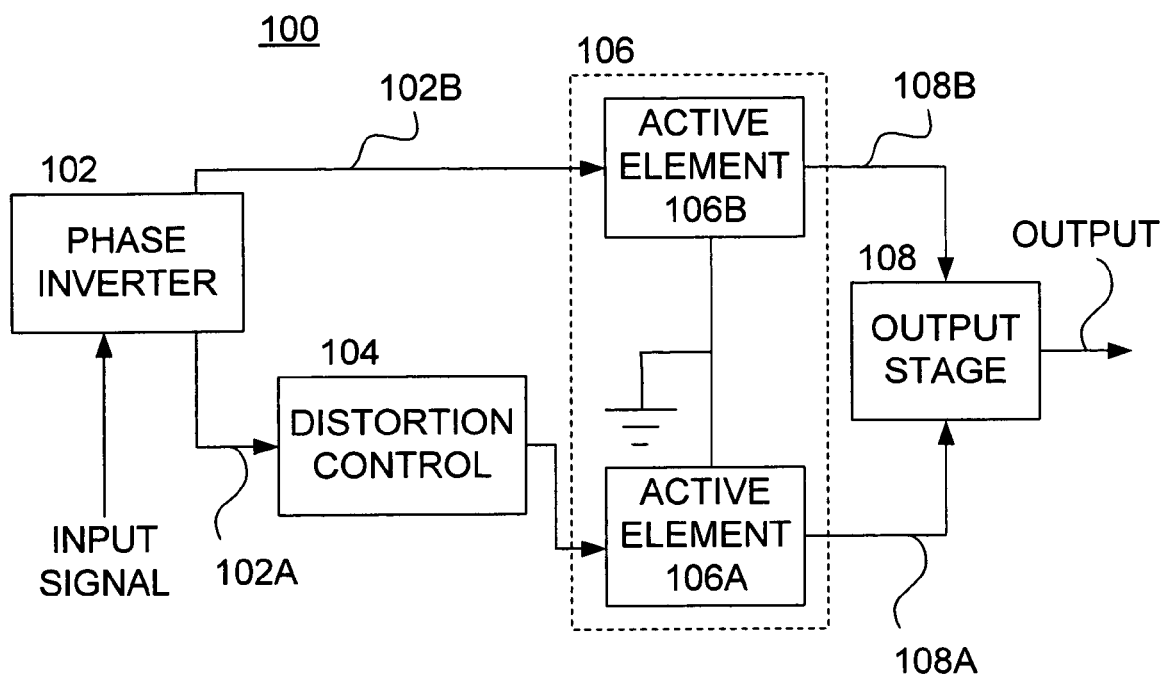
FIG. 1 is a block diagram of an amplifier circuit that is operable to provide variability in an amount of harmonic content introduced into an amplified signal in accordance with one or more aspects of the present invention.

With reference to the drawings wherein like numerals indicate like elements, there is shown in FIG. 1 a block diagram of an amplifier circuit 100 that is operable to provide variability in an amount of harmonic content introduced into an output signal of the amplifier 100 in accordance with one or more aspects of the present invention. The amplifier circuit 100 includes a phase inverter 102, a distortion controller 104, a power amplifier 106, and an output stage 108.

The phase inverter 102 is preferably operable to receive an input signal and to produce first and second drive signals 102A, 102B therefrom. While the phase inverter 102 may be implemented utilizing any of the known techniques, the first and second drive signals 102A, 102B are about 180° out of phase with respect to one another. The distortion controller 104 is preferably interposed between the phase inverter 102 and the power amplifier 106. In particular, the distortion controller 104 may be interposed between the first drive signal 102A and the power amplifier 106. It is noted, however, that in alternative embodiments of the invention the distortion controller 104 may be interposed between the second drive signal 102B and the power amplifier 106, or between both the first and second drive signals 102A, 102B and the power amplifier 106.

In the example shown in FIG. 1, the power amplifier 106 includes a first active element 106A and a second active element 106B. Those skilled in the art of power amplifier design will appreciate that there may be numerous components within each of the active elements 106A, 106B, although for the purposes of brevity and clarity, the active elements 106A, 106B will be referred to herein in the singular. As is implied by the common connection of the first and second active elements 106A, 106B through ground and their respective outputs on lines 108A, 108B to the output stage 108, the power amplifier 106 is preferably of the push-pull typology such that the combination of the signals on lines 108A, 108B results in the output signal.

In this example embodiment, the distortion control circuit 104 is preferably operable to variably alter the first drive signal 102A such that its magnitude is unbalanced with respect to the magnitude of the second drive signal 102B. In this way, the respective drive signals input to the active elements 106A, 106B of the push-pull power amplifier 106 are unbalanced, thereby producing unbalanced signals on lines 108A and 108B. Thus, the combination of the signals on lines 108A, 108B result in a distorted output signal that is rich in harmonic content, particularly even harmonics.

Figure 2:
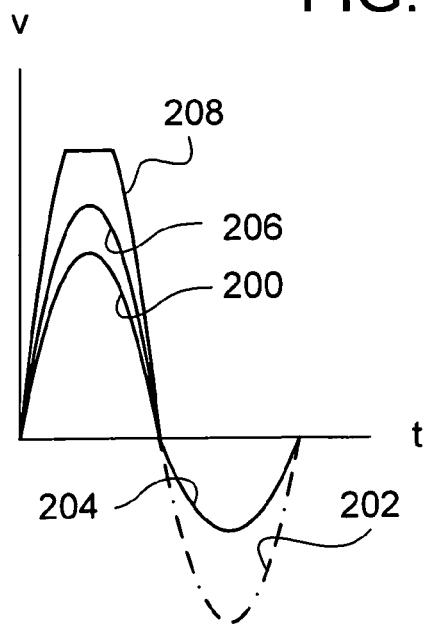
FIG. 2 is a graphical representation of variability introduced into an output waveform resulting from the amplifier circuit of FIG. 1.

With reference to FIG. 2, it is assumed for the purposes of discussion that the input signal into the amplifier circuit 100 is a sine wave having substantially zero DC content. The graph of FIG. 2 represents the output signal produced by the amplifier circuit 100 in response to such sine wave input signal. It is understood that the zero-crossings illustrated in FIG. 2 are referenced to ground (e.g., the common potential of the push-pull power amplifier 106), although any other reference potential could be utilized without departing from the spirit and scope of the present invention.

The distortion controller 104 may be adjusted such that the drive signals on lines 102A, 102B are balanced (e.g. their respective magnitudes are substantially equal) or unbalanced (e.g., their respective magnitudes are substantially unequal as discussed above). When the drive signals on lines 102A, 102B are balanced, the output signal includes a positive going portion 200 and a negative going portion 202 that are balanced and do not introduce substantial harmonic distortion. Thus, with the distortion control circuit 104 in a balanced position, the respective magnitudes of the positive portion 200 and the negative portion 202 of the output signal are substantially equal.

When the distortion controller circuit 104 is adjusted to unbalance the drive signals 102A, 102B, however, at least one of the positive and negative portions of the output signal is increased or decreased as compared with the balanced portions (200, 202). For example, the distortion control circuit 104 may decrease the magnitude of the first drive signal 102A with respect to the second drive signal 102B, thereby causing the amplification of the first active element 106A to decrease and reduce the magnitude of the negative going portion 204 of the output signal. This introduces harmonic content into the output signal, rich in second harmonic frequency content.

Depending on the specific implementation of the distortion control circuit 104, a reduction in the magnitude of the first drive signal 102A may be accompanied by an increase in the magnitude of the second drive signal 102B, thereby increasing the magnitude of the positive going portion of the output signal, such as is labeled 206. With more radical adjustment by the distortion circuit 104, such as by substantially increasing the magnitude of the second drive signal 102B, the positive going portion 208 of the output signal may clip. Still further, the magnitude of the negative going portion of the output signal may be further reduced through the control of the distortion control circuit 104, thereby introducing more harmonic distortion.

Figure 3:
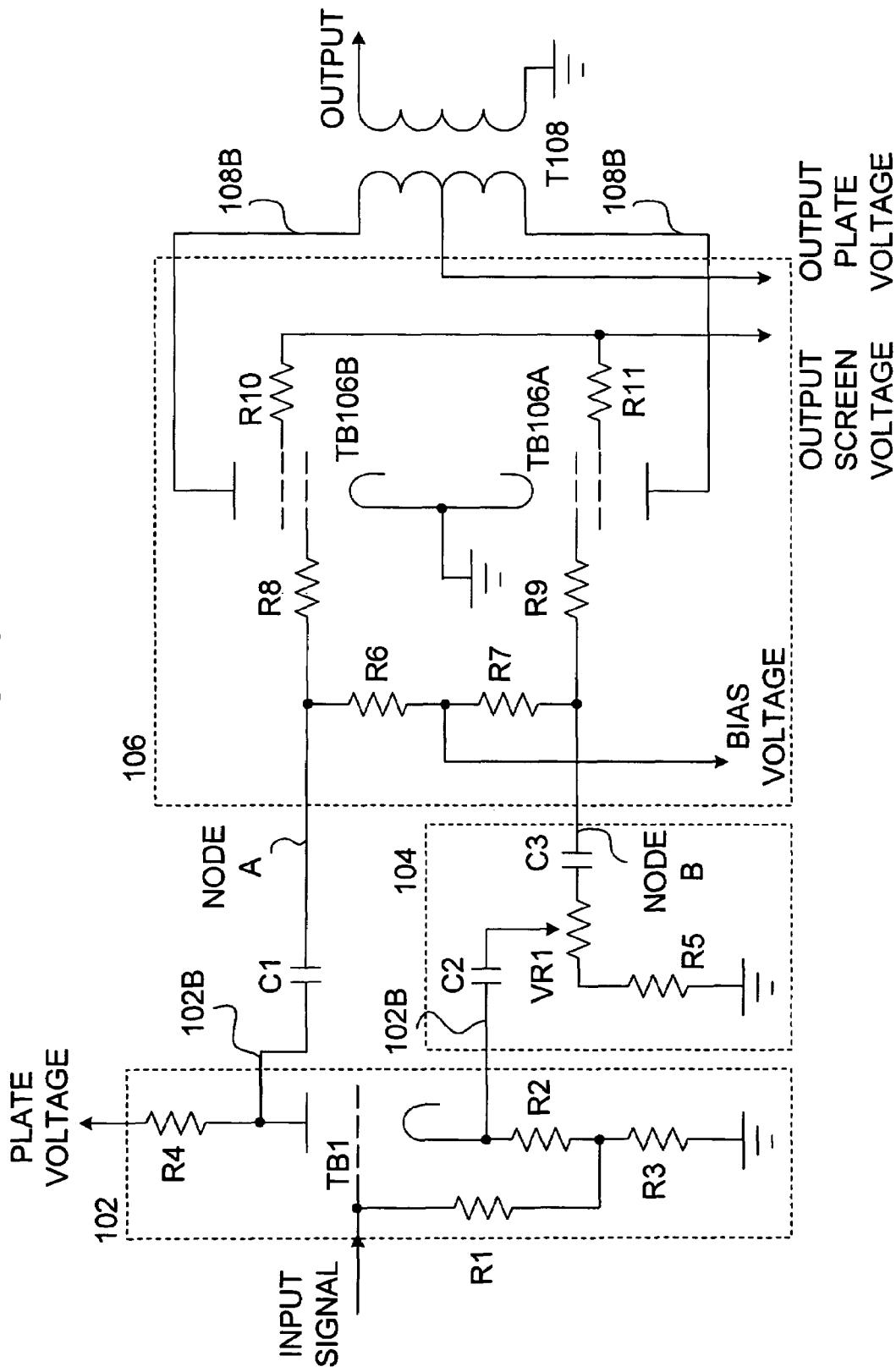
FIG. 3 is a more detailed schematic diagram of one embodiment of a tube type circuit suitable for implementing the amplifier circuit of FIG. 1.

Reference is now made to FIG. 3, which is a more detailed schematic diagram illustrating an example of a suitable circuit for implementing the amplifier 100 of FIG. 1. As shown, the phase inverter 102 may be implemented utilizing a tube TB1, and a plurality of resistors R1–R4. An input resistor R1 is coupled between a grid of the tube TB1 and a common node of a resistor divider circuit formed by resistors R2, R3 coupled in series from the cathode of the tube TB1 to ground. The plate of the tube TB1 is coupled to a plate voltage through resistor R4. The plate voltage may be on the order of about 150–400 VDC. Output from the phase inverter 102 is taken at the cathode and the plate, respectively.

The basic operation of the phase inverter 102 is as follows: Positive and negative swings in the input signal vary the grid voltage with respect to the cathode voltage such that corresponding variations in the current through the tube TB1 are achieved. The current gain through the tube TB1 is inversely proportional to the combined series resistance of R2 and R3. The variations in the current through the tube TB1 result in a varying voltage across R4 (the output of which is taken at the plate) and a varying voltage across the combined resistance of R2 and R3 (the output of which is taken at the cathode). Assuming that resistor R4 is of a value substantially equal to the combined resistances of resistors R2 and R3, then the respective magnitudes of the first and second drive signals on lines 102A and 102B will be balanced, although these drive signals will be 180° out of phase with respect to one another. The introduction of an unbalanced condition will be discussed in more detail hereinbelow.

In this example embodiment, the power amplifier circuit 106 is implemented utilizing a tube type push-pull configuration including a first tube TB106A and a second tube TB106B. The cathodes of the tubes TB106A, TB106B are coupled to a common potential, such as ground. The respective grids of the tubes are biased at a potential below the respective cathodes by way of a negative bias voltage and bias resistors R6, R7, R8 and R9. The plates of the tubes TB106A, TB106B are coupled to respective ends of a center-tapped transformer T108. The center tap of the transformer T108 is coupled to the output plate voltage, which may be on the order of about 150–500 VDC. The screens of the tubes 106A, 106B are biased by way of an output screen voltage and resistors R10, R11. It is noted that the screens are preferably biased slightly lower than the plate voltage of the tubes TB106A, TB106B, to as low as about one half of the plate voltage. The output signal is taken at the secondary of the transformer T108.

In operation, the grids of the tubes TB106A, TB106B receive the drive signals on node A and node B, respectively. Assuming a sine wave input signal, the drive signals on nodes A and B will be sine waves 180 degrees out of phase with one another. Thus, when the sine wave on node A is positive going, tube TB106A will be biased ON and draw current through one side of the center-tapped primary winding of the transformer T108 in proportion with the magnitude of the node A drive signal. At the same time, the sine wave on node B will be negative going and the tube TB106B will be biased OFF. This results in a positive going portion of a sine wave on the output of the transformer T108 (assuming appropriate winding conventions). When the sine wave on node A is negative going, the sine wave on node B is positive going and the tube TB106B will be biased ON and draw current through the other side of the center-tapped primary winding of the transformer T108 in proportion with the magnitude of the node B drive signal. The negative going sine wave on node A will bias the tube TB106B OFF. This results in a negative going portion of a sine wave on the output of the transformer T108.

In this example embodiment, the distortion control circuit 104 is preferably implemented utilizing a variable impedance circuit that is operable to variably attenuate the first drive signal on line 102A. By way of example, the distortion control circuit may include a variable resistor VR1 that operates in combination with shunt resistor R5 and series capacitors C2, C3 to provide a degree of attenuation varying from substantially zero attenuation to a maximum degree of attenuation. In particular, capacitor C2 couples the first drive signal on line 102A to the wiper arm of the variable resistor VR1. One end of the variable resistor VR1 is coupled to one end of resistor R5, the other end of resistor R5 being coupled to ground. The other end of the variable resistor VR1 is coupled to one end of the capacitor C3, the other end of capacitor C3 being coupled to the grid of the tube TB106A.

As the wiper arm of the variable resistor VR1 moves to the right, the first drive signal on line 102A is attenuated to a lesser and lesser degree, preferably to the point where there is substantially no attenuation. At that point, the signal on line 102A is capacitively coupled to the grid of the tube 106A through the series combination of capacitors C2 and C3. It is noted that this series combination is preferably substantially equal to the capacitance of capacitor C1. In this regard, it is noted that the respective values of capacitors C2 and C3 are preferably twice that of capacitor C1. When the wiper arm of the variable resistor VR1 moves to the left, the magnitude of the first drive signal on line 102A reduces in accordance with the resistor divider formed by the variable resistor VR1 and resistor R5. Advantageously, the actuation of the variable resistor VR1 may be manipulated by the user such that a desired amount of harmonic content may be achieved.

In addition, as the wiper arm of variable resistor VR1 moves to the left, the magnitude of the signal on line 102A decreases and the magnitude of the signal on line 102B increases. This is so because a lower and lower impedance (with a minimum real impedance of R5) is placed in parallel with the series combination of resistors R2 and R3. The lower impedance increases the voltage gain of the phase inverter 102 and reduces the magnitude of the first drive signal on line 102A. This is so because the current is working against a smaller impedance. At the same time, the larger current through the tube TB1 is working against resistor R4, which remains unchanged. Thus, the respective magnitudes of the signals on lines 102A and 102B are further unbalanced.

By way of example and not limitation, the resistance of resistor R1 may be on the order of about 1M Ohm, the resistance of resistor R2 may be on the order of about 1K Ohm, the resistance of resistor R3 may be on the order of about 30–100K Ohms, the resistance of resistor R4 may be on the order of about 30–100K Ohms, the resistance of resistor R5 may be on the order of about 200K Ohms, and the resistance of variable resistor VR1 may be on order of about 1M Ohm, it being preferred that this resistance is at least 10 times the resistance of resistor R3.

The activation of the variable resistor VR1 variably controls an amount of harmonic distortion in the output signal, such as was discussed hereinabove, with respect to FIG. 2. In addition, the variation in the series and shunt resistances provided by the variable resistor VR1 in combination with resistor R5 establish a varying high-pass filter characteristic in combination with capacitors C2 and C3. Thus, the activation of the variable resistor VR1 also controls a frequency response of the distortion control circuit 104 and further alters the frequency content of the output signal. In particular, the variability in the frequency response of the distortion control circuit 104 adjusts the frequency content of the positive and/or negative going portions of the output signal in addition to the harmonic distortion introduced by the increase and/or decrease in the magnitudes of the first and second drive signals 102A, 102B. This provides a further user-controlled adjustment of the frequency content of the output signal.

It is noted that the variable impedance circuit of the distortion control may be implemented using any of the known passive or active circuit configurations that can alter the impedance between line 102B and node B (or intermediate nodes therebetween. For example, the variable impedance circuit may be implemented using a resistor network that may be adjusted by way of a multi-position switch. Alternatively, the variable impedance circuit may be implemented using an active device, such as a FET that is variably controlled to produce a variable resistance. Those skilled in the art will appreciate that many other variations on the variable impedance circuit may be readily employed without departing from the spirit and scope of the invention.

Figure 4:
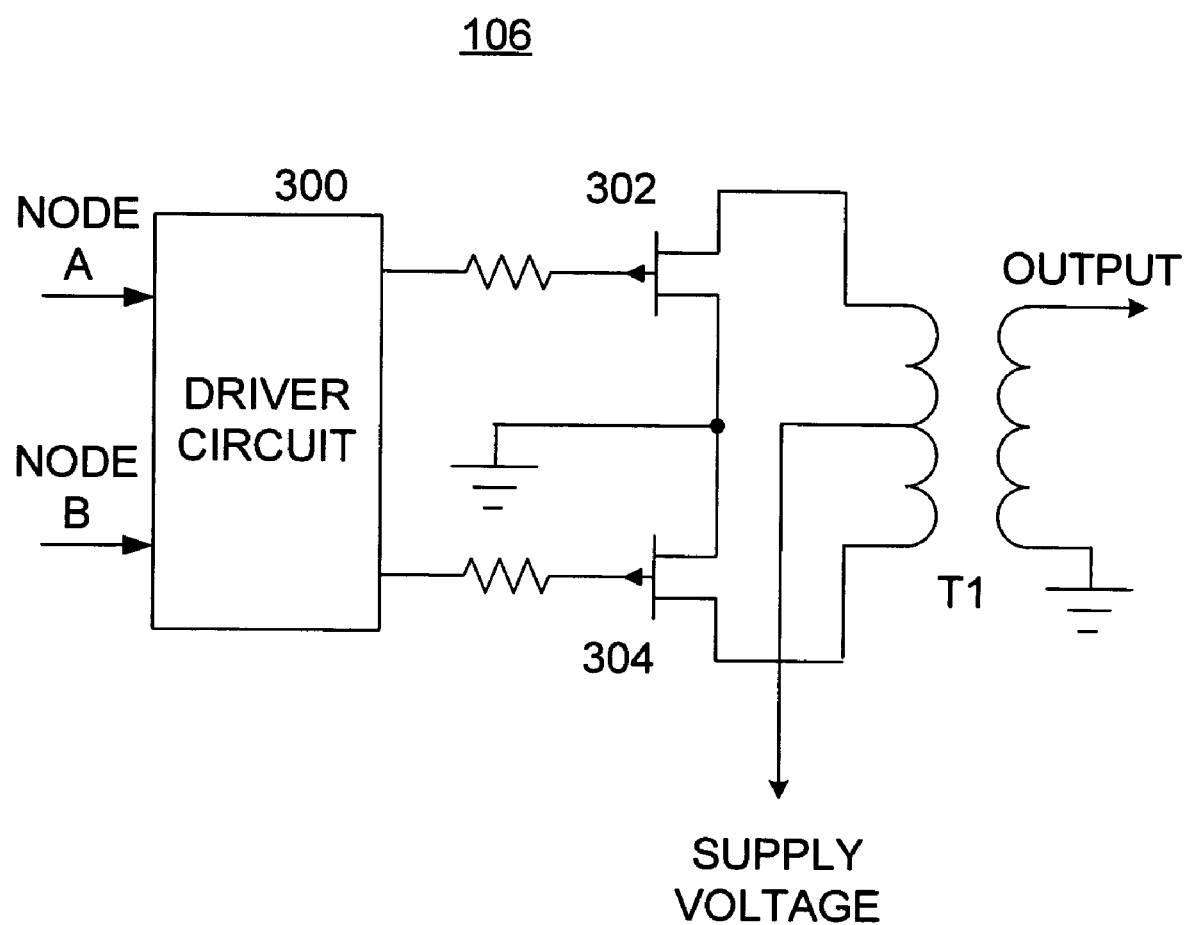
FIG. 4 is a schematic diagram of an alternative embodiment of a solid state output circuit suitable for implementing at least a portion of the amplifier circuit of FIG. 1.

Those skilled in the art will appreciate that the power amplifier 106 may be implemented utilizing any of the known techniques, such as utilizing tubes, field effect transistors, bipolar transistors, etc. In this regard, reference is made to FIG. 4, which illustrates a power amplifier 106 implemented utilizing field effect transistors 302, 304. This implementation also includes an appropriate driver circuit 300 that may receive the signals on nodes A and B of FIG. 3 and produce appropriate gate drive signals to bias the field effect transistor 302, 304 in an appropriate manner.

Advantageously, the aspects and features of the present invention provide for variability in the harmonic content introduced by an amplifier, irrespective of the harmonic content of the input to the amplifier.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   a phase inverter operable to receive an input signal and produce first and second drive signals therefrom, each about 180 degrees out of phase with respect to the other;
   a user controllable distortion control circuit operable to variably alter at least one of the first and second drive signals such that their respective magnitudes may be unbalanced in accordance with the user's control to a varying degree; and
   a push-pull output stage operable to receive the first and second drive signals and to produce an output signal therefrom exhibiting harmonic distortion when the first and second drive signals are unbalanced.

2. The apparatus of claim 1, wherein the push-pull output stage includes first and second active elements, each having at least a pair of power terminals and a signal terminal, one power terminal of each active element being coupled to a common node, and the respective first and second drive signals being coupled to the respective signal terminals.

3. The apparatus of claim 2, wherein the distortion control circuit is operable to variably increase and/or decrease the magnitude of the first drive signal with respect to the second drive signal such that the first active element is biased ON to a corresponding greater and/or lesser degree.

4. The apparatus of claim 3, wherein the first active element is operable to produce one of a positive and negative going portion of the output signal and the second active element is operable to produce the other of the positive and negative going portion of the output signal.

5. The apparatus of claim 4, wherein the distortion control circuit is operable to variably increase and/or decrease a magnitude of the one with respect to the other of the positive and negative going portions of the output signal such that a variable amount of harmonic distortion is introduced into the output signal.

6. The apparatus of claim 1, wherein the distortion control circuit includes a variable impedance circuit operable to variably attenuate the first drive signal.

7. The apparatus of claim 6, wherein the distortion control circuit includes a variable resistor divider circuit operable to provide a degree of attenuation varying from substantially zero attenuation to a maximum degree of attenuation.

8. The apparatus of claim 7, wherein the distortion control circuit includes at least one series capacitive element coupled in series with a variable series resistive element, and at least one shunt resistive element coupled in shunt with respect to the series elements.

9. The apparatus of claim 8, wherein the at least one shunt resistive element is variable.

10. The apparatus of claim 9, wherein the at least one shunt resistive element is variable in coordination with variability of the variable series resistive element.

11. The apparatus of claim 7, wherein the distortion control circuit includes:
    a first capacitor coupled from a source of the first drive signal to a first intermediate node;
    a potentiometer having a wiper arm coupled to the first intermediate node, a first terminal coupled toward a common potential, and a second terminal coupled to a second intermediate node; and
    a second capacitor coupled from the second intermediate node toward the signal terminal of the first active element.

12. The apparatus of claim 11, wherein activation of the potentiometer variably controls an amount of harmonic distortion into the output signal.

13. The apparatus of claim 12, wherein activation of the potentiometer variably controls a frequency response of the distortion control circuit.

14. The apparatus of claim 1, wherein the push-pull output stage is formed from active elements taken from the group consisting of tubes, field effect transistors and bipolar transistors.

15. A method, comprising:
    producing first and second drive signals from an input signal such that each drive signal is about 180 degrees out of phase with respect to the other;
    variably altering at least one of the first and second drive signals such that their respective magnitudes may be unbalanced to a varying degree; and
    producing an output signal from the first and second drive signals such that it includes harmonic distortion when the first and second drive signals are unbalanced.

16. The method of claim 15, further comprising producing respective positive and negative going portions of the output signal in response to the variable first and second drive signals such that one of the positive and negative going portions of the output signal increases and/or decreases in magnitude with respect to the other.

17. The method of claim 16, further comprising altering the frequency content of the one of the positive and negative going portions of the output signal in addition to the harmonic distortion introduced by the increase and/or decrease in magnitude thereof.

* * * * *